United States Patent
Pei et al.

(10) Patent No.: US 10,134,778 B2
(45) Date of Patent: Nov. 20, 2018

(54) ARRAY SUBSTRATE AND MANUFACTURING METHOD THEREOF, DISPLAY PANEL AND DISPLAY DEVICE

(71) Applicants: BOE Technology Group Co., Ltd., Beijing (CN); Beijing BOE Optoelectronics Technology Co., Ltd., Beijing (CN)

(72) Inventors: Xiaoguang Pei, Beijing (CN); Chong Liu, Beijing (CN); Zhilian Xiao, Beijing (CN); Haisheng Zhao, Beijing (CN); Zhilong Peng, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/539,773

(22) PCT Filed: Oct. 31, 2016

(86) PCT No.: PCT/CN2016/104067
§ 371 (c)(1),
(2) Date: Jun. 26, 2017

(87) PCT Pub. No.: WO2017/076260
PCT Pub. Date: May 11, 2017

(65) Prior Publication Data
US 2017/0373095 A1 Dec. 28, 2017

(30) Foreign Application Priority Data
Nov. 3, 2015 (CN) .......................... 2015 1 0738246

(51) Int. Cl.
*H01L 27/12* (2006.01)
*H01L 21/77* (2017.01)
(Continued)

(52) U.S. Cl.
CPC .......... *H01L 27/1244* (2013.01); *H01L 21/77* (2013.01); *H01L 27/02* (2013.01);
(Continued)

(58) Field of Classification Search
CPC .............. H01L 27/127; H01L 27/1244; H01L 27/1222; H01L 27/1262; H01L 27/1255;
(Continued)

(56) References Cited

U.S. PATENT DOCUMENTS 7,986,380 B2 * 7/2011 Ahn ................. G02F 1/134363
349/43
2004/0126945 A1 7/2004 Shibata et al.
(Continued)

FOREIGN PATENT DOCUMENTS

CN 101504500 A 8/2009
CN 102338959 A 2/2012
(Continued)

OTHER PUBLICATIONS

Aug. 21, 2017—(CN) First Office Action Appn 201510738246.3 with English Tran.
Jan. 26, 2017—(WO) International Search Report and Written Opinion Appn PCT/CN2016/104067 with English Tran.

*Primary Examiner* — Yosef Gebreyesus
(74) *Attorney, Agent, or Firm* — Banner & Witcoff, Ltd.

(57) ABSTRACT

A method for manufacturing an array substrate, including: forming a plurality of first metal layer patterns on a base substrate which are independent from each other, each of the plurality of first metal layer patterns including an end at a non-display region of the array substrate; forming an insulating layer on the plurality of first metal layer patterns; and forming a semiconductor pattern on the insulating layer, a portion of semiconductor pattern is disposed directly opposite to the end of the first metal layer patterns.

20 Claims, 3 Drawing Sheets

(51) Int. Cl.
*H01L 27/02* (2006.01)
*H01L 29/66* (2006.01)
*H01L 29/786* (2006.01)

(52) U.S. Cl.
CPC ............ *H01L 27/12* (2013.01); *H01L 27/127* (2013.01); *H01L 27/1222* (2013.01); *H01L 27/1262* (2013.01); *H01L 29/66765* (2013.01); *H01L 29/78669* (2013.01); *H01L 27/1255* (2013.01)

(58) Field of Classification Search
CPC ......... H01L 29/66765; H01L 29/78669; H01L 27/02; H01L 27/12; H01L 27/77
See application file for complete search history.

(56) References Cited

U.S. PATENT DOCUMENTS

2012/0037970 A1* 2/2012 Park .................. H01L 27/10817
257/296
2013/0256778 A1* 10/2013 Sim ...................... H01L 29/788
257/316
2014/0361301 A1 12/2014 Huang et al.

FOREIGN PATENT DOCUMENTS

| CN | 104576651 A | 4/2015 |
| CN | 105226055 A | 1/2016 |
| JP | 2010282216 A | 12/2010 |

* cited by examiner

ARRAY SUBSTRATE AND MANUFACTURING METHOD THEREOF, DISPLAY PANEL AND DISPLAY DEVICE

The application is a U.S. National Phase Entry of International Application No. PCT/CN2016/104067 filed on Oct. 31, 2016, designating the United States of America and claiming priority to Chinese Patent Application No. 201510738246.3 filed on Nov. 3, 2015. The present application claims priority to and the benefit of the above-identified applications and the above-identified applications are incorporated by reference herein in their entirety.

TECHNICAL FIELD

Embodiments of the present disclosure relate to an array substrate, a manufacturing method thereof, a display panel and a display device.

BACKGROUND

When designing a display product, in order to improve the anti-static electric capacity of modules of a display product, driving signals lines in a GOA (Gate driver On Array) structure is made of gate metal layer, rather than a source/drain metal layer. However, in such a design, a gate line is a separate metal line without being connected to any other components before depositing the source/drain metal layer. As shown in FIGS. 1 and 2, a gate line 1 is not connected to a GOA unit 2. In such a structure, static electricity generated on the gate line 1 due to contact or other reasons will not be released and will be discharged at a tip adjacent to the GOA unit 2, which cause the GOA unit to be damaged and seriously affect the yield of the display product.

SUMMARY

At least one embodiment of the present disclosure provide a method for manufacturing an array substrate, comprising:
forming a plurality of first metal layer patterns on a base substrate which are independent from each other, each of the plurality of first metal layer patterns comprising an end at a non-display region of the array substrate;
forming an insulating layer on the plurality of first metal layer patterns; and
forming a semiconductor pattern on the insulating layer, a portion of semiconductor pattern is disposed directly opposite to the end.

According to one embodiment of the present disclosure, the method further comprises heating the base substrate on which the semiconductor pattern is formed.

According to one embodiment of the present disclosure, a width of the end of the metal layer pattern is greater than that of other portions of the first metal layer pattern.

According to one embodiment of the present disclosure, the end is configured to be connected to a gate driving circuit of the array substrate.

According to one embodiment of the present disclosure, a plurality of thin film transistors are formed on the array substrate, wherein forming a semiconductor pattern on the insulating layer which is disposed directly opposite to the end comprises:
forming an active layer of the thin film transistor and the semiconductor pattern on the insulating layer at the same time through a single patterning process.

At least one embodiment of the present disclosure further provides an array substrate, comprising:

a plurality of first metal layer patterns which are disposed on a base substrate of the array substrate and are independent from each other, each of the plurality of first metal layer patterns comprising an end disposed in the non-display region of the array substrate;
an insulating layer disposed on the plurality of first metal layer patterns; and
a semiconductor pattern disposed on the insulating layer and directly opposite to the end.

According to one embodiment of the present disclosure, the first metal layer patterns are formed to be a pattern of a gate line, the end is configured to be connected to a gate driving circuit of the array substrate.

According to one embodiment of the present disclosure, the end has a width greater than that of other portions of the first metal layer pattern.

According to one embodiment of the present disclosure, the array substrate further comprises a plurality of thin film transistors, wherein the semiconductor pattern and an active layer of the thin film transistor are disposed on the same level and are made of the same material.

According to one embodiment of the present disclosure, both the semiconductor pattern and the active layer are made of amorphous silicon.

At least one embodiment of the present disclosure further provides a display panel comprising the array substrate mentioned above.

At least one embodiment of the present disclosure further provides a display device comprising the array substrate mentioned above.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE SIGNS

Figure 1:
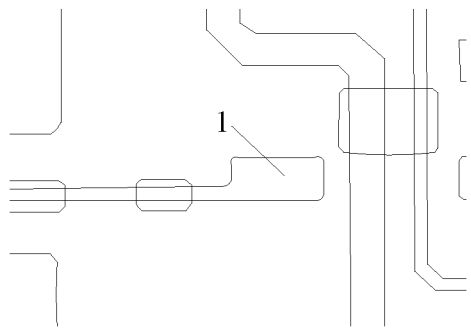
FIG. 1 is a schematic view showing arrangement of gate lines in a conventional array substrate.
Figure 2:
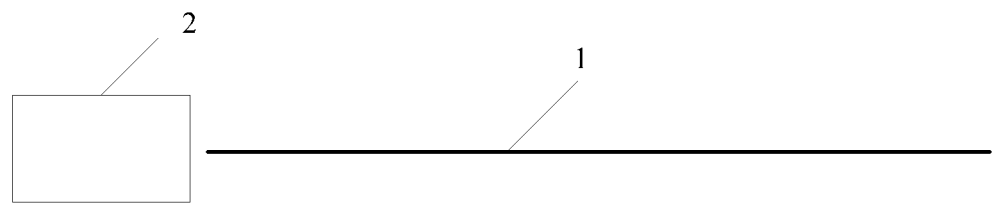
FIG. 2 is a schematic view showing positional relationship between a gate line and a GOA unit in a conventional array substrate.
Figure 2:
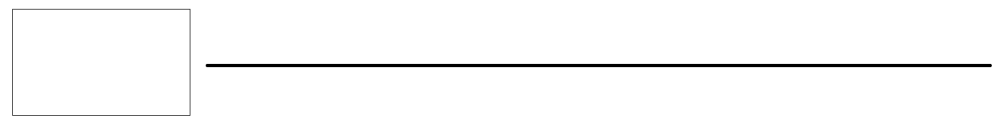
Figure 2:
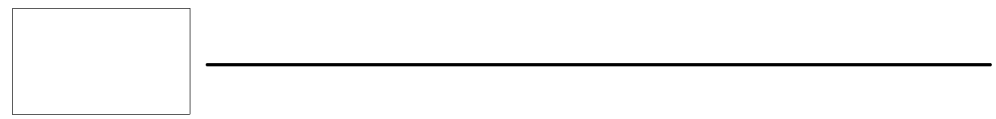
Figure 2:
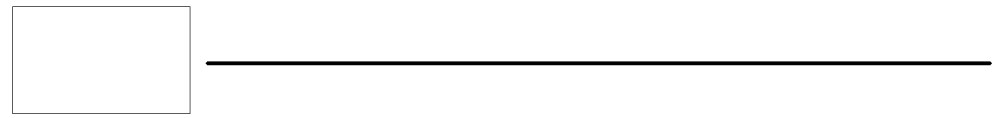

1, gate line; 2, GOA unit; 3, driving signal line; 4, a-Si pattern; 5, end of gate line; 6, semiconductor pattern; 10; base substrate; 11, insulating layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

At least one embodiment of the present disclosure provides a method for manufacturing an array substrate, comprising:

forming a plurality of first metal layer patterns on the base substrate which are independent from each other, each of the plurality of first metal layer patterns comprising an end at a non-display region of the array substrate;

forming an insulating layer on the plurality of first metal layer patters; and forming a semiconductor pattern on the insulating layer, a portion of the semiconductor pattern is disposed directly opposite to the end.

In the embodiment, an insulating layer is formed on the plurality of first metal layer patterns which are independent from each other, and a semiconductor pattern, a portion of which is disposed directly opposite to the ends of the plurality of first metal layer patters, is formed on the insulating layer. Thus, in a subsequent preheating process for depositing a second metal layer, electrical conductivity of the semiconductor pattern is enhanced. The portion of the semiconductor pattern overlapping the end together with the end forms a capacitor. Thus, a voltage level of charges accumulated at the end of the first metal layer pattern is lowered through charging the capacitor, such that point discharge hardly occurs to charges accumulated at the end of the first metal layer pattern. As a result, damage to the GOA unit due to point discharge at the end of the first metal layer pattern is reduced, thereby improving the yielding of display products.

Further, the method comprises heating the base substrate on which the semiconductor pattern is formed.

The semiconductor pattern has low electrical conductivity at room temperatures. Even though the semiconductor pattern can form a capacitor along with the end directly opposite to the semiconductor pattern, charging the capacitor is not effective. During heating the base substrate on which the semiconductor pattern is formed, the temperature of the semiconductor rises to 170° C. from room temperatures, and the electrical conductivity of the semiconductor pattern is enhanced. Thus, the capacitor can be charged effectively, and the voltage level of charges accumulated at the end of the first metal layer pattern is greatly lowered.

Further, forming a plurality of first metal layer patterns on the base substrate which are independent from each other, each of the plurality of first metal layer patterns comprising an end comprises forming the first metal layer pattern, wherein the end of the first metal layer pattern has a width greater than other portion of the first metal layer pattern.

In one embodiment of the present disclosure, the end of the first metal layer pattern has a width greater than other portion of the first metal layer, thus, a portion of the semiconductor pattern which is disposed directly opposite to the end can be configured to be wider. As capacitance of a capacitor is proportional to the positive area of the two electrodes of the capacitor and meanwhile the capacitance is equal to the ratio of a quantity of charge to a voltage, if the positive area of the two electrodes of the capacitor gets greater, the capacitance of a capacitor formed between the end of the first metal layer pattern and the semiconductor pattern gets greater, and the voltage across the two electrode of the capacitor will be decreased accordingly as the quantity of charge accumulating on the end of the first metal layer pattern. That is, the voltage on the end of the first metal layer pattern will be decreased.

In one embodiment of the present disclosure, forming a first metal layer pattern, wherein the end of the first metal layer pattern has a width greater than other portion of the first metal layer pattern, comprising:

forming a pattern of a plurality of gate lines independent from each other on the base substrate, wherein the respective gate lines have an end disposed in the non-display region which has a width greater than other portion of the respective gate lines and the end is configured to be connected to a gate driving circuit of the array substrate. That is, the first metal layer pattern is a gate line pattern, an end of the gate line has a width greater than other portion of the gate line, the end of the gate line is disposed in the non-display region of the array substrate and is configured to be connected to the gate driving circuit of the array substrate.

Thus, when preheating the array substrate to deposit a source/drain metal layer, a capacitor is formed between the end of the gate line and the semiconductor pattern at an overlapping region thereof, and a voltage of charges accumulated at the end of the gate line will be decreased by charging the capacitor. Thus, point discharge is unlikely to occur to the charges accumulated at the end of the gate line. And in turn, damage to the GOA unit due to point discharge at the end of the gate line will be decreased, thereby improving the yield of the display product.

And further, the array substrate comprises a plurality of thin film transistors, forming a semiconductor pattern on the insulating layer corresponding to the end comprises:

forming simultaneously an active layer of the thin film transistor and the semiconductor pattern on the insulating layer through a single patterning process. Thus, the semiconductor pattern can be formed without additional patterning process, patterning processes are saved and the cost of the product can be reduced.

At least one embodiment of the present disclosure provides an array substrate, comprising:

a plurality of first metal layer patterns independent from each other formed on a base substrate, the plurality of first metal layer patterns have their respective ends formed in a non-display region of the array substrate;

an insulating layer disposed on the plurality of first metal layer patterns; and a semiconductor pattern formed on the insulating layer and disposed directly opposite to the ends.

Prior to depositing a second metal layer, an insulating layer is formed on the plurality of first metal layer patterns independent from each other and a semiconductor pattern corresponding to the ends is formed on the insulating layer, thus, when preheating the array substrate for depositing the second metal layer, conductivity of the semiconductor pattern will be enhanced and a capacitor will be formed between the semiconductor pattern and the first metal layer pattern directly opposite to the semiconductor pattern. And a voltage of charges accumulated at the end of the first metal layer pattern will be reduced by charging the capacitor. Thus, point discharge is unlikely to occur to the charges accumulated at the end of the first metal layer pattern, and damage to a GOA unit due to point discharge at the end of the first metal layer pattern will be decreased, thereby improving the yield of display product.

In one embodiment of the present disclosure, the end of the first metal layer pattern has a width greater than other portion of the first metal layer, thus, a portion of the semiconductor pattern which is disposed directly opposite to the end can also be configured to be wider. As capacitance of a capacitor is proportional to the positive area of the two electrodes of the capacitor and meanwhile the capacitance is equal to the ratio of a quantity of charge to a voltage, if the positive area of the two electrodes of the capacitor gets greater, capacitance of a capacitor formed between the end of the first metal layer pattern and the semiconductor pattern gets greater, and the voltage across the two electrode of the capacitor will be decreased accordingly as the quantity of charge accumulating on the end of the first metal layer pattern. That is, the voltage on the end of the first metal layer pattern will be decreased. Thus, influence of the charges accumulated at the end of the first metal layer pattern on the GOA unit can be further mitigated.

In one embodiment of the present disclosure, the first metal layer pattern is a pattern of gate line, wherein the end has a width greater than other portion of the gate line and the end is configured to be connected to a gate driving circuit of the array substrate. Thus, when preheating the array substrate so as to deposit a source/drain metal layer, a capacitor is formed between the end of the gate line and the semiconductor pattern at an overlapping region thereof, and a voltage of charges accumulated at the end of the gate line will be decreased by charging the capacitor. Thus, point discharge is unlikely to occur to the charges accumulated at the end of the gate line. And in turn, damage to the GOA unit due to point discharge at the end of the gate line will be decreased, thereby improving the yield of the display product.

And further, there are a plurality of thin film transistors formed on the array substrate, the semiconductor pattern and active layers of the thin film transistors are made of same material and are disposed on the same level. Thus, the semiconductor pattern and the active layers of the thin film transistors can be formed at the same time through a single patterning process, thereby saving patterning processes and reducing cost of the product.

In one embodiment of the present disclosure, the semiconductor pattern and a pattern of the active layers are formed of a-Si.

At least one embodiment of the present disclosure further provides a display panel comprising the array substrate as described above, and the display panel can be a liquid crystal display panel and an OLED display panel.

At least one embodiment of the present disclosure further provides a display device comprising the array substrate as described above. Other components of the display device can be referred to conventional arts and will not be described herein. The display device can be any product or element with display function, such as a liquid crystal display panel, an electronic paper, a liquid crystal TV set, a liquid crystal display device, a digital frame, a cell phone, a tablet PC, and the like.

The array substrate according to the disclosure will be described hereinafter in detail in connection with the figures.

Figure 3:
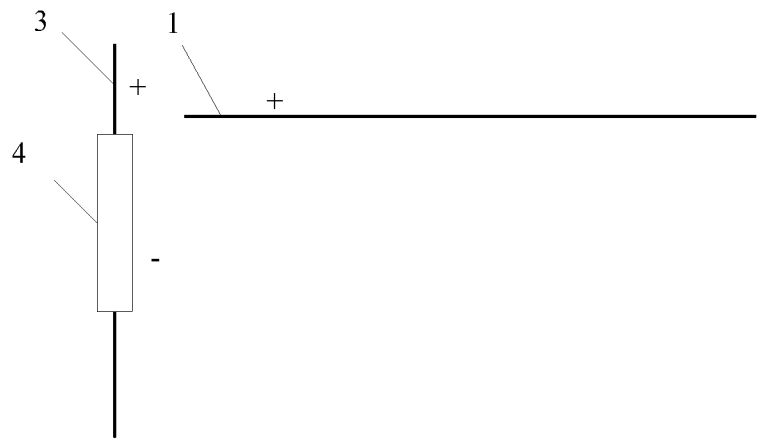
FIG. 3 is a schematic view showing charges accumulated on the gate line and on the GOA unit in a conventional array substrate.

As illustrated in FIG. 3, in conventional manufacturing processes of an array substrate, before depositing a source/drain metal layer, a gate line 1 in a non-display region of the array substrate is not connected with a GOA unit 2, and charges will be produced at the gate line 1 due to contact or other reasons, cannot be discharged and will be accumulated on the gate line 1. Before depositing a source/drain metal layer, conductivity of a semiconductor pattern will be enhanced after being preheated, and a capacitor will be formed between a driving signal line 3 which is configured to be connected with the GOA unit 2 and an a-Si pattern 4 disposed above the gate line 3, wherein the driving signal line 3 and the a-Si pattern 4 respectively forms the upper electrode and the lower electrode of the capacitor. If positive charges are accumulated on the gate line 1, negative charges will be accumulated on a corresponding a-Si pattern according to capacitor effect. Then, a tip of the gate line 1 and a tip of the a-Si pattern 4 respectively carry charges with different polarities. If enough charges are accumulated, electro-static discharge (ESD) will occur at the end of the gate line 1 and the a-Si pattern 4, that is, a defect of GOA ESD during manufacturing an array substrate, which affects the yield of the array substrate.

Figure 4:
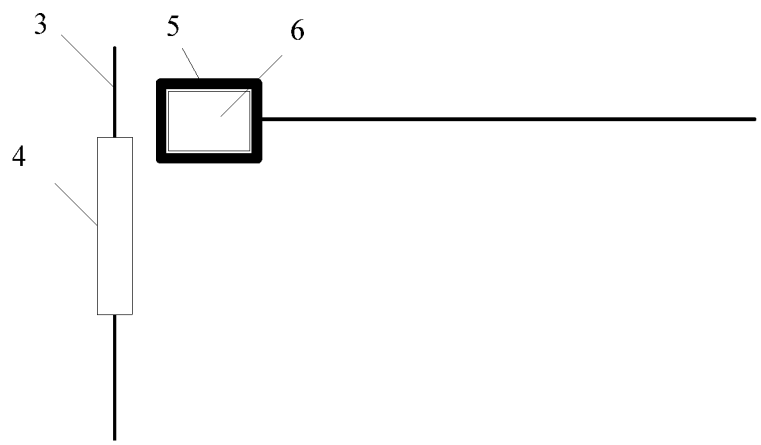
FIG. 4 is a schematic view showing positional relationship between a gate line and a GOA unit according to one embodiment of the present disclosure.
Figure 5:
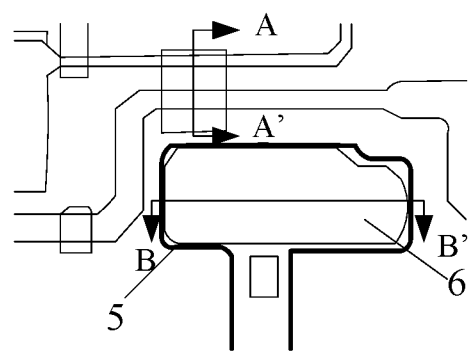
FIG. 5 is a schematic view showing an illustrative arrangement of the gate and the semiconductor pattern according to one embodiment of the present disclosure.
Figure 6:
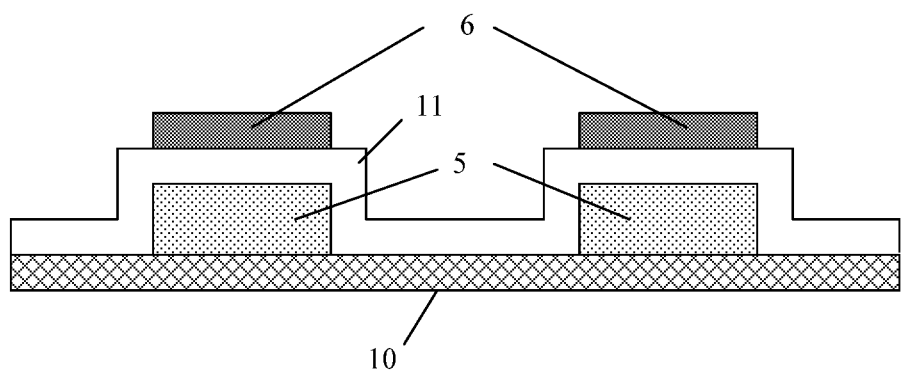
FIG. 6 is a cross sectional view taken along the arrow A-A' in FIG. 5.
Figure 7:
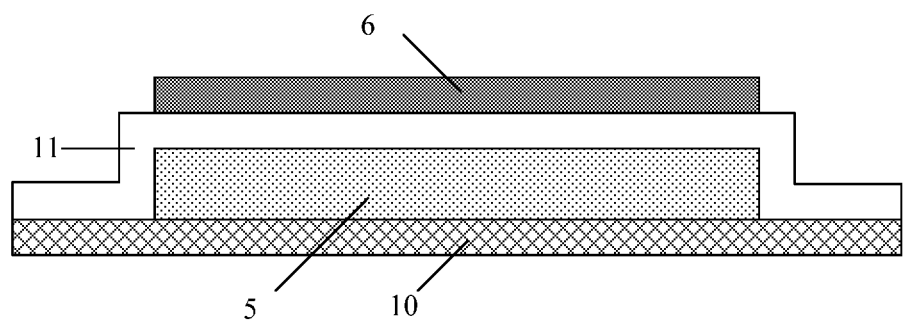
FIG. 7 is a cross sectional view taken along the arrow B-B' in FIG. 5.

In the embodiments of the present disclosure, a property of semiconductor that conductivity thereof will be enhanced at high temperature is utilized. As illustrated in FIG. 4 and FIG. 5, in the non-display region of the array substrate, a semiconductor pattern 6 is formed on an insulating layer 11 which is disposed on the gate line 1, the semiconductor pattern 6 is disposed opposite to an end 5 of the GOA unit 2. At room temperature, the semiconductor pattern 6 has poor conductivity, and effect of charging a capacitor is not good enough even though a capacitor can be formed between the end 5 and a portion of the semiconductor pattern 6 disposed directly opposite to the end 5.

In preheating the array substrate before depositing a source/drain metal layer, the temperature of the semiconductor pattern 6 rises from room temperature to 170° C. (in a case that the semiconductor pattern 6 is made of a-Si) and conductivity of the semiconductor pattern 6 is enhanced, and a capacitor is formed at an area of the semiconductor pattern disposed directly opposite to the end 5 of the gate line. Thus, charging the capacitor can be performed efficiently. As the static electricity has a high voltage and few charges and as the voltage is equal to the ratio of the amount of charges to the capacitance, the voltage is decreased. With decreasing of the voltage, point discharge hardly occurs to the charges accumulated at the end 5 of the gate line, thereby reducing damage to the GOA unit due to point discharge at the end 5 of the gate line and improving the yielding of display products.

In one embodiment of the present disclosure, in order to enhance the effect of charging the capacitor, the end 5 of the gate line has a width greater than the width of other portion of the gate line. And accordingly, the width of the semiconductor pattern 6 is relative great too. As the capacitance is proportional to the positive area of the two capacitor electrodes, the capacitance formed between the end 5 of the gate line and the semiconductor pattern 6 is effectively increased. For example, the width of the end 5 of the gate line can be 2 to 10 times of the width of other portion of the gate line, and the size of the semiconductor pattern 6 changes as the size of the end 5 of the gate line changes, for example, the size of the semiconductor pattern 6 is equal to the size of the end 5 of the gate line.

Additionally, in order to not increase the number of patterning process for manufacturing the array substrate, the semiconductor patter 6 can be made of a material which is same as material for the active layer of the thin film transistor in the array substrate, and formed in the same level as the active layer. Thus, the semiconductor patter 6 and the active layer of the thin film transistor in the array substrate can be formed through a single patterning process, thereby decreasing the cost of the array substrate. As the active layer of the thin film transistor is typically formed of a-Si, the semiconductor pattern 6 can also be formed of a-Si. Of course, the active layer of the thin film transistor can be alternatively formed of other materials, and accordingly, the semiconductor pattern 6 can also be formed of a material which is same as the material for the active layer of the thin film transistor.

The embodiment is described by taking the first metal layer pattern being a gate line as an example. Of course, the first metal layer pattern is not limited to the gate line. During manufacturing the array substrate, after forming the first metal layer pattern, or before the second metal layer patter, a semiconductor pattern which is disposed directly facing the first metal layer pattern is formed on the insulating layer disposed over the first metal layer in the non-display region, so as to reduce the voltage of the static electricity accumulated on the end of the first metal layer pattern.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510738246.3 filed on Nov. 3, 2015, the disclosure of which is hereby entirely incorporated by reference as a part of the present disclosure.

The invention claimed is:

1. A method for manufacturing an array substrate, comprising:
   forming a plurality of first metal layer patterns on a base substrate which are independent from each other, each of the plurality of first metal layer patterns comprising an end at a non-display region of the array substrate;
   forming an insulating layer on the plurality of first metal layer patterns; and
   forming a semiconductor pattern on the insulating layer, a portion of which is disposed directly opposite to the end, and the portion having a width equal to a width of the end.

2. The method according to claim 1, further comprising: heating the base substrate on which the semiconductor pattern is formed.

3. The method according to claim 2, wherein a width of the ends of the plurality of first metal layer patterns is greater than that of other portions of the plurality of first metal layer patterns.

4. The method according to any one of claim 2, wherein the end is configured to be connected to a gate driving circuit of the array substrate.

5. The method according to claim 2, wherein a plurality of thin film transistors are formed on the array substrate, wherein forming the semiconductor pattern on the insulating layer which is disposed directly opposite to the end comprises:
   forming an active layer of the plurality of thin film transistors and the semiconductor pattern on the insulating layer at the same time through a single patterning process.

6. The method according to claim 1, wherein a width of the ends of the plurality of first metal layer patterns is greater than that of other portions of the plurality of first metal layer patterns.

7. The method according to any one of claim 6, wherein the end is configured to be connected to a gate driving circuit of the array substrate.

8. The method according to claim 6, wherein a plurality of thin film transistors are formed on the array substrate, wherein forming the semiconductor pattern on the insulating layer which is disposed directly opposite to the end comprises:
   forming an active layer of the thin film transistor and the semiconductor pattern on the insulating layer at the same time through a single patterning process.

9. The method according to claim 1, wherein the end is configured to be connected to a gate driving circuit of the array substrate.

10. The method according to claim 9, wherein a plurality of thin film transistors are formed on the array substrate, wherein forming the semiconductor pattern on the insulating layer which is disposed directly opposite to the end comprises:
    forming an active layer of the thin film transistor and the semiconductor pattern on the insulating layer at the same time through a single patterning process.

11. The method according to claim 1, wherein a plurality of thin film transistors are formed on the array substrate, wherein forming the semiconductor pattern on the insulating layer which is disposed directly opposite to the end comprises:
    forming an active layer of the plurality of thin film transistors and the semiconductor pattern on the insulating layer at the same time through a single patterning process.

12. An array substrate, comprising:
    a plurality of first metal layer patterns which are disposed on a base substrate of the array substrate and are independent from each other, each of the plurality of first metal layer patterns comprising an end disposed in a non-display region of the array substrate;
    an insulating layer disposed on the plurality of first metal layer patterns; and
    a semiconductor pattern, disposed on the insulating layer and directly opposite to the end, wherein a portion of the semiconductor pattern disposed directly opposite to the end has a width equal to a width of the end.

13. The array substrate according to claim 12, wherein the plurality of first metal layer patterns are formed to be a pattern of a gate line, the end is configured to be connected to a gate driving circuit of the array substrate.

14. The array substrate according to claim 13, wherein the end has a width greater than that of other portions of the plurality of first metal layer patterns.

15. The array substrate according to claim 13, wherein the array substrate further comprises a plurality of thin film transistors, wherein the semiconductor pattern and an active layer of the thin film transistor are disposed on the same level and are made of the same material.

16. The array substrate according to claim 12, wherein the end has a width greater than that of other portions of the plurality of first metal layer patterns.

17. The array substrate according to claim 12, wherein the array substrate further comprises a plurality of thin film transistors, wherein the semiconductor pattern and an active layer of the plurality of thin film transistors are disposed on the same level and are made of the same material.

18. The array substrate according to claim 17, wherein both the semiconductor pattern and the active layer are made of amorphous silicon.

19. A display panel, comprising the array substrate according to claim 12.

20. A display device, comprising the array substrate according to claim 12.

* * * * *